United States Patent [19]
Doyle

[11] Patent Number: 5,949,108
[45] Date of Patent: Sep. 7, 1999

[54] SEMICONDUCTOR DEVICE WITH REDUCED CAPACITANCE

[75] Inventor: Brian S. Doyle, Cupertino, Calif.

[73] Assignee: Intel Corporation, Santa Clara, Calif.

[21] Appl. No.: 08/884,921

[22] Filed: Jun. 30, 1997

[51] Int. Cl.$^6$ ............................ H01L 27/01; H01L 27/12
[52] U.S. Cl. ............................................ 257/347; 257/340
[58] Field of Search ..................................... 257/340, 347; 438/286

[56] References Cited

U.S. PATENT DOCUMENTS

| | | |
|---|---|---|
| 5,332,913 | 7/1994 | Shappir . |
| 5,358,891 | 10/1994 | Tsang et al. . |
| 5,489,792 | 2/1996 | Hu et al. . |
| 5,567,629 | 10/1996 | Kubo . |
| 5,580,807 | 12/1996 | Sery et al. . |
| 5,583,067 | 12/1996 | Sanchez . |

FOREIGN PATENT DOCUMENTS

| | | | |
|---|---|---|---|
| 5-75123 | 3/1993 | Japan | ...................................... 257/347 |
| 5-167043 | 7/1993 | Japan | ...................................... 257/347 |

*Primary Examiner*—Valencia Martin-Wallace
*Attorney, Agent, or Firm*—Blakely, Sokoloff, Taylor & Zafman

[57] ABSTRACT

A process for producing a metal oxide semiconductor (MOS transistor) is provided. The process includes the following steps. At least two trenches are formed at a surface of a first substrate. Oxide is deposited onto the at least two trenches. The at least two trenches each have a surface spaced apart from the surface of the first substrate. A second substrate is placed onto the surface of the first substrate. A layer is delaminated from the first substrate. The layer includes the at least two oxide-filled trenches and a portion of the first substrate. The layer is then bonded to a second substrate. First and second active regions are then formed, in the portion of the first substrate, overlaying the surfaces of the at least two trenches.

11 Claims, 3 Drawing Sheets

SEMICONDUCTOR DEVICE WITH REDUCED CAPACITANCE

BACKGROUND OF THE INVENTION (1) Field of the Invention

The present invention generally relates to the field of semiconductor devices. More specifically, the present invention relates to fabrication of semiconductor devices, particularly field effect transistors.

(2) Description of the Related Art

Silicon-on-insulator (SOI) technology is well-known in the art. This technology utilizes a layer of semiconductor material overlying an insulation layer formed on a supporting bulk wafer. An SOI structure may be formed by way of a number of well-known processes, such as separation by implanted oxygen (SIMOX), zone melting and recrystallization (AMR), or Bonded and Etchback (BESOI).

Typically, an SOI structure includes a silicon film formed on a layer of silicon oxide buried in a silicon substrate.

Field effect transistors, such as MOSFETs fabricated in the silicon film of an SOI structure, have many advantages over MOSFETs fabricated on traditional bulk silicon substrates. Such advantages include reduced parasitic capacitance, resistance to short-channel effect, steeper sub-threshold slopes, increased current drive, higher packing density, and simpler processing steps. In the past, SOI applications have been limited due to high cost and inferior crystalline quality of SOI wafers. Nevertheless, recent advancements in the SOI silicon film quality, buried oxide quality, and manufacturing throughput have lead to numerous ultra large scale integration (ULSI) applications. The lower complexity/cost of SOI integrated circuit processes, relative to the constantly increasing cost of bulk silicon submicron integrated circuit processes, confers SOI technology a great potential becoming a preferred low cost mainstream production technology.

SUMMARY OF THE INVENTION

The present invention provides a process for producing a metal oxide semi-conductor field effect transistor. One embodiment according to the present invention is a metal oxide semi-conductor field effect transistor (MOSFET) produced by the following process. Two trenches are formed at a surface of a first substrate. A first dielectric layer is formed into the two trenches. A second substrate is placed onto the surface of the first substrate. A layer from the first substrate is deliminated. The layer includes the two trenches and a portion of the first substrate. The layer is bonded to the second substrate. First and second active regions are formed in the portion of the first substrate.

Despite the seductive qualities of SOI technology, there are certain impediments that undermine part of the benefits of using SOI technology for high-performance, high-density ULSI circuits. MOSFETs fabricated with SOI technology are typically non-fully depleted MOSFETs. Unlike bulk silicon MOSFETs, the substrate of an SOI MOSFET is usually electrically floating. In a non-fully depleted MOSFET, carriers generated by impact ionization accumulate near the channel-oxide junction of the MOS transistor. Eventually sufficient carriers will accumulate to forward bias the body with respect to the gate thus lowering the threshold voltage through the body-bias effect. This effect is further explained in conjunction with the structure illustrated in FIG. 1.

FIG. 1 illustrates a SOI MOS transistor 100. The SOI MOS transistor 100 includes a gate 130 overlying a space (channel region) 108 between drain 107 and source 106. The drain 107 and source 106 are isolated from silicon substrate 102 by a layer of oxide 110. This layer of oxide, helps reduce the drain-substrate and source-substrate capacitances. Despite the attractiveness of the SOI technology which includes good subthreshold characteristics and low junction capacitance due to the oxide layer 110, the SOI technology has disadvantageous side effects. For example, due to the layer of oxide 110, that also isolates the channel region 108, charge 114 builds up on the back interface 116 of channel 108. This charge causes the threshold voltage Vt of the MOS transistor 100 to vary.

When the threshold voltage varies, the drive current varies too. A MOS transistor fabricated by SOI technologies has a relatively low drain current when this transistor is turned on, while later, after transistor 100 has been in use for a longer time, it would have a higher drain current. This is caused by the floating body effect. Due to a strong electric field between the source and the drain, charges from the source and driven to the drain are accelerated by the electric field in the channel. The accelerated charges suffer collisions that create electron-hole pairs. The holes resulting from the collision are repelled by the gate and are attracted to back interface 116. Further, the holes 114 at the back interface 116 cause the threshold voltage to change, (decrease) as the back interface of the device no longer has the same potential. The longer transistor 100 is on, the more charge builds up at the back interface 116 resulting in a decrease in the threshold voltage. A decrease in the threshold voltage causes extra source-drain current to flow thereby producing abnormality in the transfer (current-voltage) characteristic of transistor 100. The floating body effect thus causes unpredictability as to the behavior of the transistor with respect to the current-voltage characteristic.

It is desirable to provide a field effect transistor that has most advantages provided by SOI technology, such as for example reduced junction capacitance, while at the same time having reduced if not eliminated floating body effect.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one having ordinary skill in the art should recognize that the invention can be practiced without these specific details. In some instances, well-known process steps, device structures, and techniques have not been shown in detail to avoid obscuring the present invention.

The present invention provides a method for producing a Metal Oxide-semiconductor (MOS) transistor with reduced junction capacitance. The method involves reducing junctions capacitances of the MOS transistor through selective oxidation of the region beneath the junctions. The steps of the method according to the present invention are explained hereinafter in conjunction with FIGS. 2–9.

Figure 1:
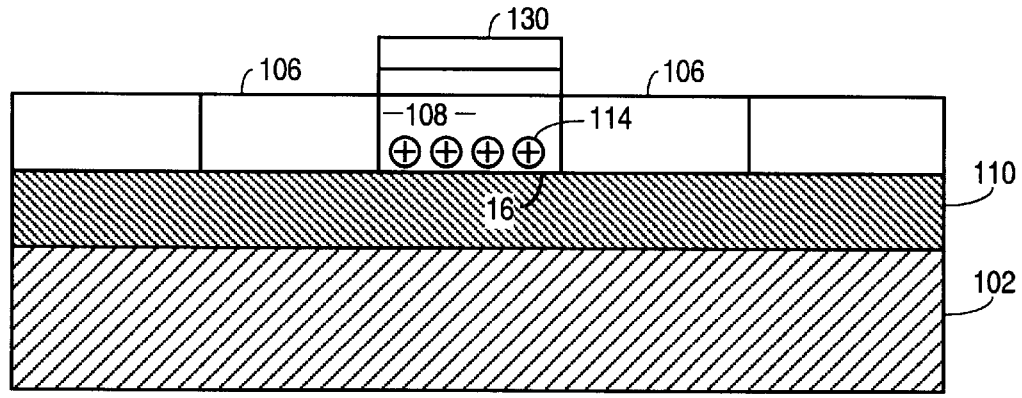
FIG. 1 illustrates a cross-sectional view of a conventional MOS transistor produced acing to SOI technology.
Figure 2:
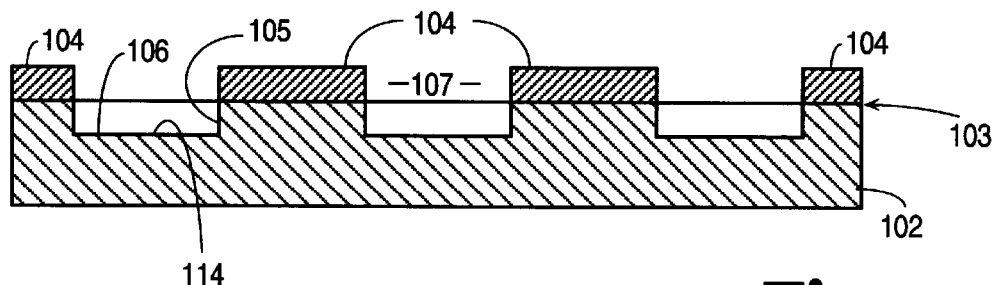
FIG. 2 illustrates cross-sectional view of a substrate patterned by a photoresist mask and including several trenches.

FIG. 2 illustrates a cross-sectional view of a first substrate 102, preferably made of silicon, with a photoresist mask 104 patterning first substrate 102. Mask 104 is not limited to a photoresist mask but it may be a hard mask as well. Photo resist mask 104 is formed onto a top surface 103 of substrate 102. The photoresist mask 104 is formed to define positions onto top surface 103, where gates (and field oxide insulating the gates) of MOS transistors to be produced by way of the method according to the present invention are to be placed. Windows 107 in photoresist mask 104 define positions of active regions, of the MOS transistors to be produced by way of the method according to the present invention described herein. The thickness of the photoresist mask 104 may be approximately 2,000 Angstroms.

After deposition of photoresist mask 104, trenches 106 are formed into first substrate 102 at a top surface 103 thereof. Trenches 106 are formed at locations defined by windows 107. Trenches 106 are defined by side walls 105 and by a bottom surface 114. Bottom surface 114 is spaced apart from top surface 103 of substrate 102. A distance (depth) between top surface 103 of the substrate and bottom surface 114 of a trench has a measure within an approximate range of 0.1–0.3 $\mu$m. An etching process may be utilized for forming trenches 106, although it should be noted that other processes may be used to form these trenches. The etching process may be carried out by chlorine etch chemistry, such as $BCl_3/Cl_2$, $H_2/Cl_2/SiCl_4$, and $CHCl_3/O_2/N_2$, or other suitable etch chemistry known in the art. Next trenches 106 are filled with oxide and the photoresist mask 104 is removed, typically by an etchant that is selective between oxide and the material of which the photoresist is made of. Etching the photoresist and filling trenches with oxide are processes well-known to persons skilled in the art.

Figure 3:
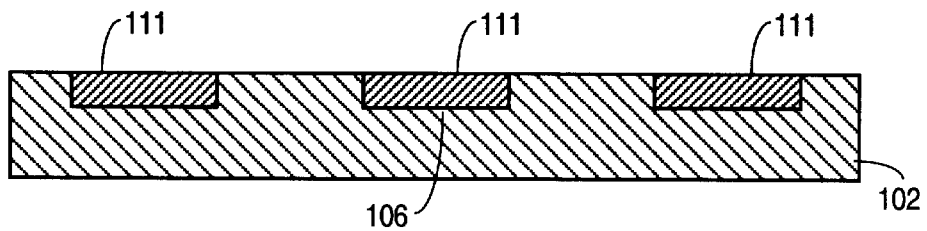
FIG. 3 illustrates a cross-sectional view of the substrate after the photoresist mask has b removed and the trenches have been filled with oxide.

FIG. 3 illustrates a cross-sectional view through substrate 102 after resist 104 has been removed and trenches 106 have been filled with oxide 111 that may be, for example, silicon oxide $SiO_2$ or silicon oxinitride ($SiO_xN_y$). The oxide can be deposited and/or grown in trenches 106. Oxide may be deposited by any suitable process known in the art. One such process is Tetraethyl orthosilicate deposition which is known in the art. In case oxide is grown, the process involves initially growing a very thin layer of oxide at bottom surfaces 114 of trenches 106. The process of growing oxide is continued by further depositing oxide onto the grown layer of oxide by way of a chemical vapor deposition (CVD) process. The deposited oxide 111 is then subjected to a densification process. The densification process helps avoiding bubbles into oxide layers 111. Surface 115 of the deposited oxide is then subjected to a polishing process to planarize surface 115. Polishing may be performed by way of a chemical mechanical polishing (CMP) process, which is well-known in the art. Polished oxide film 111 is thus formed in trenches 106. The thickness of oxide film 111 is typically equal to the depth of trenches 106, i.e., is in a range of approximately 0.1–0.3 $\mu$m.

Figure 4:
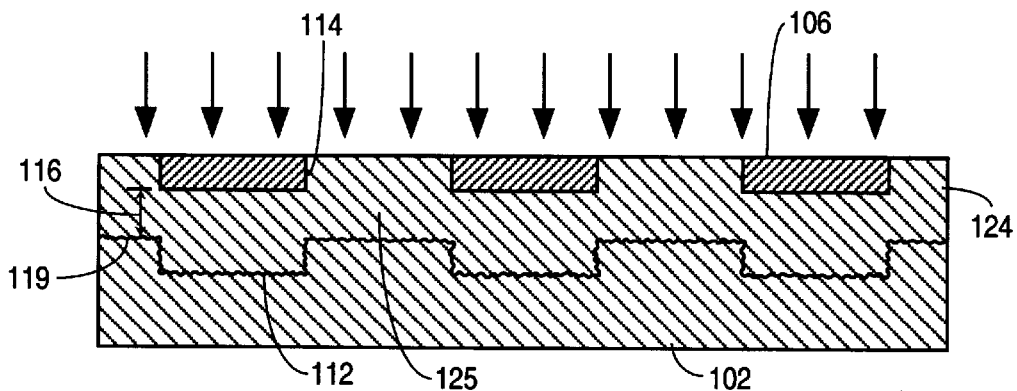
FIG. 4 illustrates a cross-sectional view of the substrate with a damaged surface produced in the substrate.

FIG. 4 illustrates a cross-sectional view of silicon substrate 102 with oxide-filled trenches 106 during a next step of the process according to the present invention. At this step ionized Hydrogen H($2\times10^{16}$–$2\times10^{17}$ particles/$Cm^3$) is implanted in substrate 102 to produce a continuous stress surface 112 in substrate 102 below trenches 106. Stress surface 112 causes delamination of layer (film) 124, defined by stress surface 112 and top surface 103, when substrate 102 is heated to a temperature in the approximate range of 400° C.–600° C. Film 124 includes oxide-filled trenches 106 and a portion 125 of first substrate 102. An energy at which Hydrogen is implanted is selected to obtain a predetermined thickness of film 124. In one embodiment according to the present invention, a thickness 116 of film 124 measured from bottom surface 114 to stress surface 112 is approximately 0.1 $\mu$m.

Figure 5:
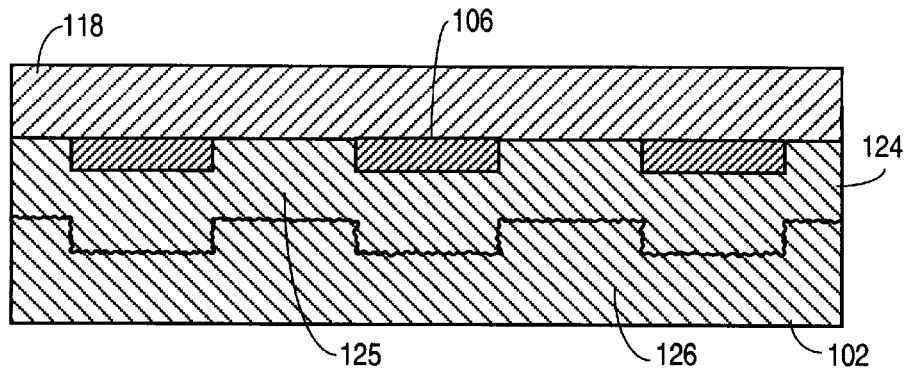
FIG. 5 illustrates a cross-sectional view of the substrate with a second substrate placed thereon.

FIG. 5 illustrates a cross-sectional view of substrate 102 with oxide-filled trenches 106 and stress surface 112 during a next step of the process according to the present invention. This step involves placement of a second substrate 118, preferably made of silicon, over first substrate 102. The assembly of first and second substrates 118 and 102 is heated to a temperature in a first approximate range of 400°–600° C. This causes film 124, defined by stress region 112, to debond (delaminate) from first substrate 102. Bottom part 126 of first substrate 102 is removed and heating is further continued to a temperature in a second approximate range of 800°–1000° at which a good interface is formed between second substrate 118 and film 124 to cause bonding of film 124 to second substrate 118.

Figure 6:
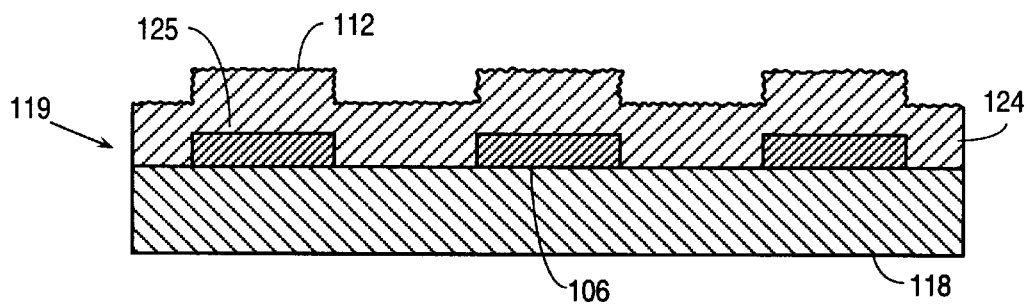
FIG. 6 illustrates an assembly, turned upside down, of a second substrate and a film delaminated from the first substrate.

An assembly 119 including film 124 bonded to second substrate 118 is turned upside down as shown in FIG. 6. By virtue of turning the assembly upside down, oxide-filled trenches 106 become "buried" oxide trenches. These trenches 106 are "buried" underneath portion 125 that initially was found beneath trenches 106 before assembly 119 was turned upside down.

Figure 7:
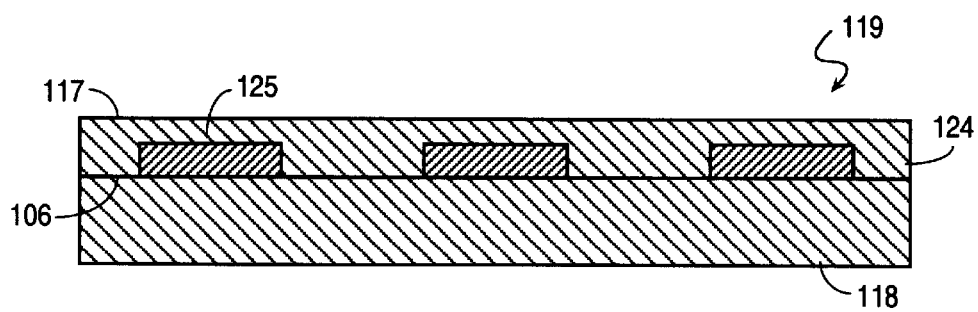
FIG. 7 illustrates a cross-sectional view through the assembly with the damaged surface polished off.
Figure 8:
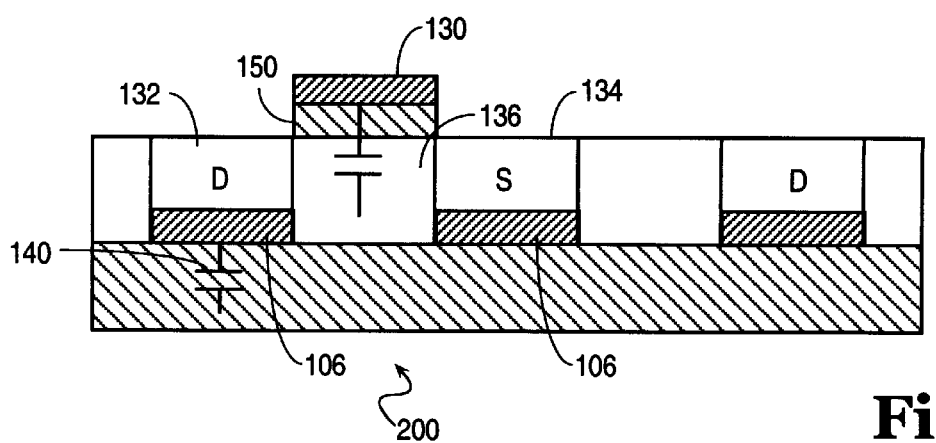
FIG. 8 illustrates a MOS transistor, based, on the assembly obtained by the method according to the present invention.

Next step involves polishing damaged surface 112 to make it smooth and flat by way of a chemical mechanical polishing (CMP) process. FIG. 7 illustrates the assembly 119 of second substrates 118 and film 124 bonded thereto with the damaged surface 112 polished off into top surface 117. FIG. 8 illustrates a cross-sectional view of a MOS transistor 200 formed by further processing assembly 119. Once damaged surface 112 is polished off, an oxide insulation layer (not shown) is formed on polished top surface 117 of the assembly. The oxide insulation layer is processed according to well-known MOS processing techniques to obtain oxide insulation regions 150. Gate 130 may be made of polysilicon, by way of non-limiting example. Oxide insulation region 150 and gate 130 are aligned between and above a space formed between two successive oxide-filled trenches 106. Gate 130 is formed onto oxide insulation region 150 by well-established MOS processing techniques. Oxide insulation region 150 insulates gate 130 from active regions 132 and 134 formed into film 124.

Active regions (junctions) 132 (drain) and 134 (source), superimposed with oxide trenches 106, are formed in alignment with these trenches. The thickness of active regions 132 and 134 measured in the plane in which the cross section is taken may be in a range of 0.05 $\mu$m–0.2 $\mu$m. Conventional techniques such as ion implantation or doping, which are well-known in the art, may be used for forming active regions 132 and 134. Active regions 132 and 134 may include Boron or Phosphorous implants or any suitable doped implant.

A MOS transistor 200 is therefore produced with an oxide region 106 underneath active regions 132 and 134. Oxide regions 106 are selectively disposed underneath junctions 132 and 134 to cause a decrease in each junction's capacitance, symbolically represented as 140. Unlike conventional devices produced by SOI processes, MOS transistor 200, produced by the process according to the present invention does not have a layer of oxide at the back of channel 136. Accordingly, MOS transistor 200 obtained by the process according to the present invention has a reduced, if not eliminated floating body effect while taking advantage of the benefits of oxide regions 106 disposed underneath drain and source 132 and 134. Oxide regions 106 cause junction capacitances 140 (which may be drain-substrate capacitances and source-substrate capacitances) to decrease thereby causing the overall capacitance of MOS transistor 200 to decrease such that a faster MOS transistor 200 is obtained.

Figure 9:
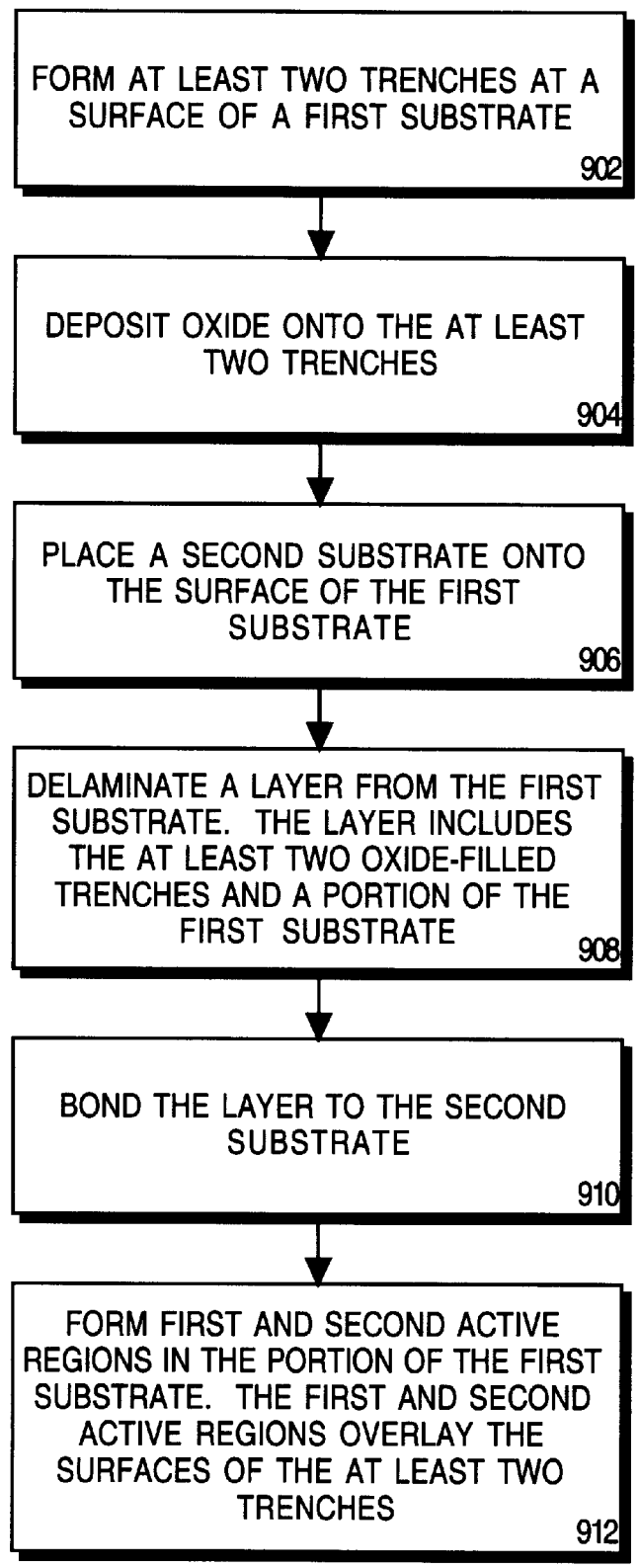
FIG. 9 is a flow chart diagram illustrating the steps of the method according to the present invention.

FIG. 9 illustrates a flow chart diagram in connection with the method according to the present invention. The method starts at step 902 where at least two trenches are formed at a surface of a first substrate. At step 904, oxide is deposited into the at least two trenches. The method further continues at step 906 where a second substrate is placed onto the surface of the first substrate. At step 908, a layer from the first substrate is delaminated. The layer includes the at least two oxide-filled trenches and a portion of the first substrate. The delaminated layer is then bonded at step 910 to the second substrate. At step 912, first and second active regions are formed in the portion of the first substrate included in the delaminated layer. The first and second active regions overlay the surfaces of the at least two oxide-filled trenches.

Note that while the present invention has been described in connection with forming at least two trenches filled with oxide, the present invention also applies to forming one oxide-filled trench to be placed underneath the drain or the source to reduce one of the drain-substrate or source-substrate capacitances.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

I claim:

1. A Metal Oxide Semiconductor Field Effect (MOSFET) transistor produced by the process of:
   a. forming two trenches at a surface of a first substrate;
   b. forming a first dielectric layer into said two trenches;
   c. placing a second substrate onto said surface of said first substrate;
   d. delaminating a layer from said first substrate, said layer including said two trenches and a portion of said first substrate;
   e. bonding said layer to said second substrate; and
   f. forming, in said portion of said first substrate, first and second active regions.

2. The MOSFET produced by the process of claim 1 further forming a gate overlaying a space between said two trenches.

3. The MOSFET produced by the process of claim 1 wherein delaminating a layer from the first substrate includes creating a stress surface into the first substrate said stress surface defining said portion of said first substrate.

4. The MOSFET produced by the process of claim 3 wherein creating a stress surface includes implanting Hydrogen ions into said first substrate.

5. The MOSFET produced by the process of claim 3 wherein delaminating a layer from the first substrate further includes heating said first substrate and said second substrate to a temperature in a first approximate range of 400° to 600° C.

6. The MOSFET produced by the process of claim 1 wherein bonding said layer to said second substrate, includes heating the first and second substrates to a temperature in a second approximate range of 800° to 1000° C.

7. The MOSFET produced by the process of claim 1 further including polishing said stress surface.

8. The MOSFET produced by the process of claim 1 wherein framing, in said portion of said first substrate, first and second regions includes aligning said first and second active regions with said two trenches.

9. The MOSFET produced by the process of claim 2 wherein forming a gate overlaying a space between said first and second active regions includes aligning said gate with said space.

10. The MOSFET produced by the process of claim 1 wherein said two trenches have a depth in the approximate range of 0.1–0.3 μm.

11. The MOSFET produced by the process of claim 3 wherein said portion of said first substrate has a thickness, measured from a surface of the two trenches to the stress surface in the approximate range of 0.05 μm–0.2 μm.

* * * * *

UNITED STATES PATENT AND TRADEMARK OFFICE
CERTIFICATE OF CORRECTION

PATENT NO. : 5,949,108
DATED : September 7, 1999
INVENTOR(S) : Brian S. Doyle It is certified that error appears in the above-identified patent and that said Letters Patent is hereby corrected as shown below:

In column 2 at line 51 delete "b" and insert --been--

Signed and Sealed this

Twenty-ninth Day of February, 2000

*Attest:*

Q. TODD DICKINSON

*Attesting Officer*     *Commissioner of Patents and Trademarks*